United States Patent

Tsukamoto et al.

[11] Patent Number: 5,930,269
[45] Date of Patent: Jul. 27, 1999

[54] TESTING SYSTEM FOR SEMICONDUCTOR DEVICE WITHOUT INFLUENCE OF DEFECTIVE DEVICE

[75] Inventors: Teruaki Tsukamoto; Atsushi Nigorikawa, both of Toyko, Japan

[73] Assignee: NEC Corporation, Tokyo, Japan

[21] Appl. No.: 08/882,078

[22] Filed: Jun. 25, 1997

[30] Foreign Application Priority Data

Jun. 27, 1996 [JP] Japan ................................ 8-167690

[51] Int. Cl.⁶ .................................................. G01R 31/28
[52] U.S. Cl. ........................................ 371/22.31; 324/765
[58] Field of Search ........................... 371/22.31, 22.32, 371/22.34, 22.35, 22.6, 25.1, 27.5, 22.5, 27.1, 27.7; 395/181, 182.1, 183.01, 183.06, 183.07, 185.01, 183.13; 364/488, 489, 550; 324/765

[56] References Cited

U.S. PATENT DOCUMENTS

| | | | |
|---|---|---|---|
| 5,235,600 | 8/1993 | Edwards | 371/22.3 |
| 5,343,478 | 8/1994 | James et al. | 371/22.3 |
| 5,519,713 | 5/1996 | Baeg et al. | 371/22.1 |
| 5,546,407 | 8/1996 | Komatsu | 371/27 |
| 5,581,562 | 12/1996 | Lin et al. | 371/22.1 |
| 5,617,420 | 4/1997 | Whetsel | 370/402 |
| 5,617,531 | 4/1997 | Crouch et al. | 395/183.06 |

*Primary Examiner*—Joseph E. Palys
*Assistant Examiner*—Nadeem Iqbal
*Attorney, Agent, or Firm*—Whitham, Curtis & Whitham

[57] ABSTRACT

A testing system selectively activates products of a semiconductor integrated circuit device mounted on a burn-in board, supplies test data signals to the products to see whether or not a defective product is mixed into the products, and a power distributor incorporated in the testing system supplies electric power only to the activated products so that non-activated products do not affect the test data signals.

11 Claims, 8 Drawing Sheets

TESTING SYSTEM FOR SEMICONDUCTOR DEVICE WITHOUT INFLUENCE OF DEFECTIVE DEVICE

FIELD OF THE INVENTION

This invention relates to a testing system for a semiconductor integrated circuit device and, more particularly, to a testing system for a burn-in test on a semiconductor device and a testing method used therein.

DESCRIPTION OF THE RELATED ART

A typical example of the testing system is illustrated in FIG. 1 of the drawings. The prior art testing system largely comprises a burn-in board 1, a control signal generator 2 for supplying scanning signals SCN1/SCN2/.../SCNm and a common control signal CMN to the burn-in board 1, a power supply unit 3 and a data interface 4 connected between the burn-in board 1 and a diagnostic unit (not shown). Data signals I/O1 to I/On are transferred through the data interface 4 between the diagnostic unit and the burn-in board 1. Test data information is represented by the data signals I/O1 to I/On supplied from the diagnostic unit to the burn-in board 1, and a test result is carried by the data signals I/O1 to I/On supplied from the burn-in board 1 to the diagnostic unit.

Products of a semiconductor integrated circuit device IC11/IC12/IC1n, IC21/IC22/IC2n, ICm1/ICm2/ICmn to be diagnosed are mounted on sockets (not shown) arranged in rows and columns on the burn-in board 1, and are connected through the contact pins of the sockets to the signal lines printed on a circuit board. The products of the semiconductor integrated circuit device IC11 to ICmn are powered with power potential Vcc and the ground potential supplied from the power supply unit 3. The test signals I/O1 to I/On are respectively supplied to the rows of products IC11-ICm1, IC12-ICm2 and IC1n-ICmn, and return to the data interface 4 therefrom. The scanning signals SCN1 to SCNm are respectively supplied to the columns of products IC11-IC1n, IC21-IC2n, and ICm1-ICmn, and the common control signal CMN is distributed to all the products of the semiconductor integrated circuit device IC11 to ICmn.

Turning back to FIG. 1, the control signal generator 2 includes a scan clock generator 2a, a scan signal distributor 2b and a scan controller 2c. The scan clock generator 2a generates a clock signal CLK, and supplies the clock signal CLK to the scan signal distributor 2b. On the other hand, the scan controller 2c generates a selecting signal SEL selectively specifying the signal lines between the scan signal distributor 2b and the burn-in board 1, and supplies the selecting signal SEL to the scan signal distributor 2b. The scan signal distributor 2b is responsive to the selecting signal SEL so as to sequentially transfer the clock signal CLK to the signal lines specified by the selecting signal SEL as the scanning signals SCN1 to SCNm. Each of the scanning signal SCN1 to SCNm is supplied to signal pins of the associated products IC11-IC1n, IC21-IC2n or ICm1-ICmn for selecting memory cells and starting the read/write sequence.

The control signal generator 2 further includes a common signal generator 2d, and the common signal generator 2d supplies the common signal CMN to the burn-in board 1.

The burn-in test is carried out as follows. The power voltage Vcc, the ground voltage and the common signal CMN of an active high level are supplied to all the products of the semiconductor integrated circuit device IC11 to ICmn. The scan controller 2c sequentially specifies the columns of products IC11-IC1n, IC21-IC2n, ... and ICm1-ICmn, and, accordingly, the scan signal distributor 2b sequentially changes the scanning signals SCN1 to SCNm to an active high level as shown in FIG. 3. As a result, the columns of products IC11-IC1n, IC21-IC2n and ICm1-ICmn are sequentially activated so as to respond to the data signals. Namely, the first column of products IC11-IC1n, the second column of products IC21-IC2n and the last column of products ICm1-ICmn are activated with the scanning signal SCN1, SCN2, and SCNm for time periods T1, T2 and Tm, respectively. While the scanning signal SCN1/SCN2/SCNm is activating the associated column of products, test data are supplied through the data lines I/O0-I/On so as to write the test data into the products of the associated column, and the test data are read out from the products to the data interface 4. For example, while the scanning signal SCN1 is staying in the active high level for the time period T1, the test data are written from the data lines I/O0-I/On to the products IC11 to IC1n, and, thereafter, the test data are read out from the products IC11 to IC1n to the data lines I/O1 to I/On. The other products of the semiconductor integrated circuit device IC21-IC2n and ICm1-ICmn never respond to the test data in the time period T1, because the associated scanning signals SCN2 to SCNm remain inactive. On the other hand, while the scanning signal SCN2 is staying in the active high level in the time period T2, the test data are transferred between the data lines I/O1 to I/On and the second column of products IC21-IC2n, and the first column of products IC21-IC2n and the last column of products ICm1-ICmn do not respond to the test data. Thus, the data lines I/O1 to I/On are shared between the columns of products IC11-IC1n, IC21-IC2n, ICm1-ICmn.

However, the prior art testing system encounters a problem in an erroneous diagnosis. In detail, when a product with a damaged data pin is mixed in a column of products of the semiconductor integrated circuit device, the damaged data pin discharges current from the data line to the ground line, and changes the logic level of the test data read out from a product of another column subjected to the test. The diagnostic unit checks the read-out data bit to see whether or not the read-out data bit is matched with an expected logic level. Even if the product of the semiconductor integrated circuit device had exactly produced the read-out data bit on the data line, the damaged data pin changed the logic level of the read-out data bit on the data line, and the prior art testing system diagnoses the product to be defective.

The product with a damaged data pin is delivered as a partially defective product, because the partially defective product can behave as an excellent electric circuit component in so far as the damaged data pin is not used in the electric circuit. In order to prevent the prior art testing system from the erroneous diagnosis, the partially defective products are previously separated from the excellent products, and are further classified into sub-groups depending upon the kinds of trouble. However, such a previous separating work and the classifying work consume time and labor, and increases the inspection cost of the semiconductor integrated circuit device.

SUMMARY OF THE INVENTION

It is therefore an important object of the present invention to provide a testing system which carries out a test on selected products without influence of non-selected products.

To accomplish the object, the present invention proposes to selectively supply electric power to products activated by a selecting signal.

In accordance with the present invention, there is provided a testing system for diagnosing products of a semiconductor device comprising: a board member selectively mounting the products divided into product groups respectively assigned addresses; a plurality of first signal lines electrically connected to the product groups, and supplying a selecting signal successively representing the addresses at different timings to the product groups for selectively activating the products; a plurality of power supply lines electrical connected to the product groups, and selectively supplying an electric power to the products specified by the selecting signal; a plurality of second signal lines electrically connected to the product groups, and supplying data signals to the products so that the products specified by the selecting signals respond to the data signals; and a diagnostic unit connected to the second signal lines so as to check the second signal lines to see whether or not the products specified by the selecting lines are defective.

The testing system may sequentially carry out a plurality of test items.

The testing system further comprise a judging unit which checks preliminary diagnoses produced for each test item to see whether or not the products pass all the test items.

BRIEF DESCRIPTION OF THE DRAWINGS

The features and advantages of the testing system according to the present invention will be more clearly understood from the following description taken in conjunction with the accompanying drawings in which.

DESCRIPTION OF THE PREFERRED EMBODIMENTS

First Embodiment

Figure 1:
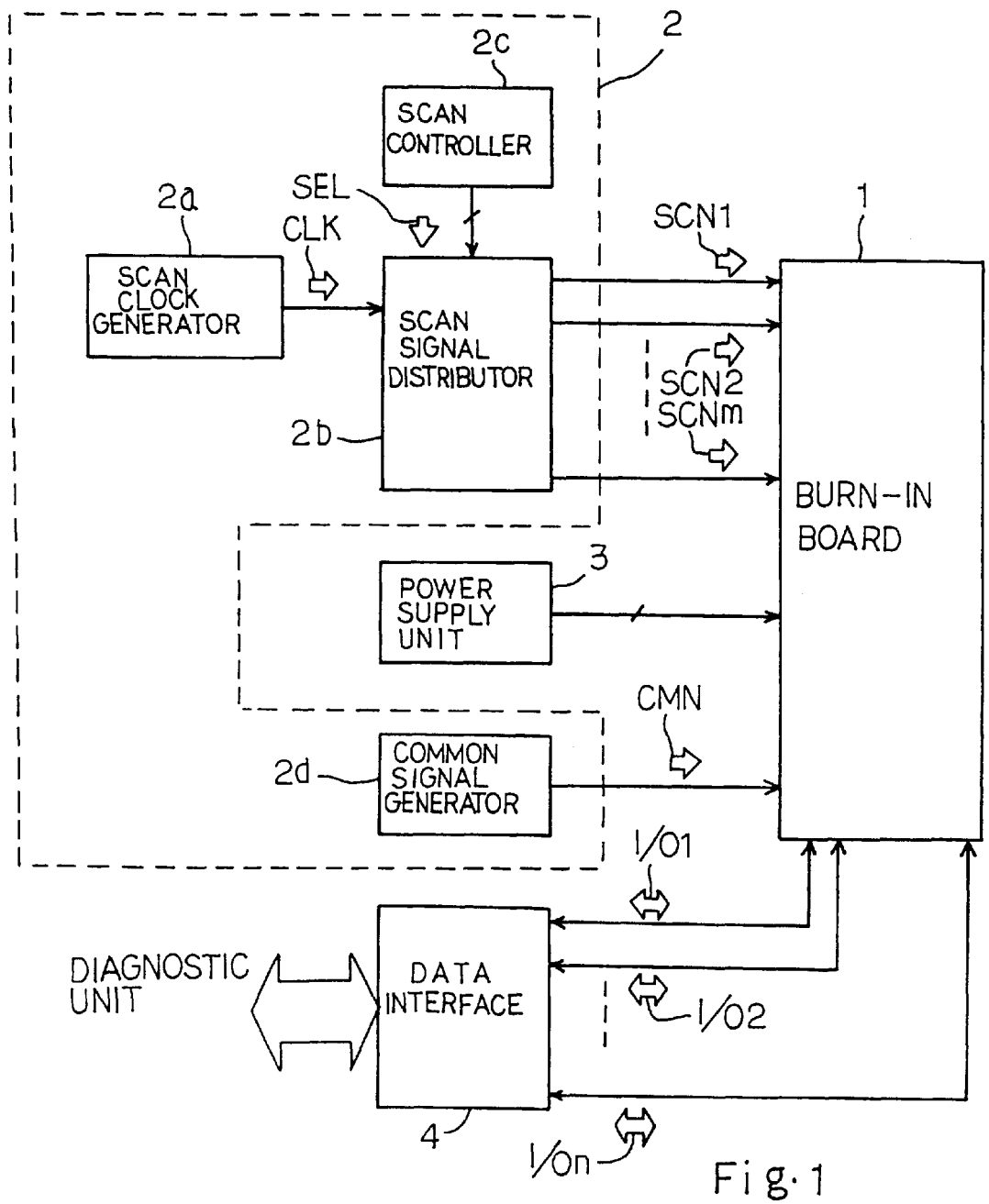
FIG. 1 is a block diagram showing the prior art testing system.
Figure 2:
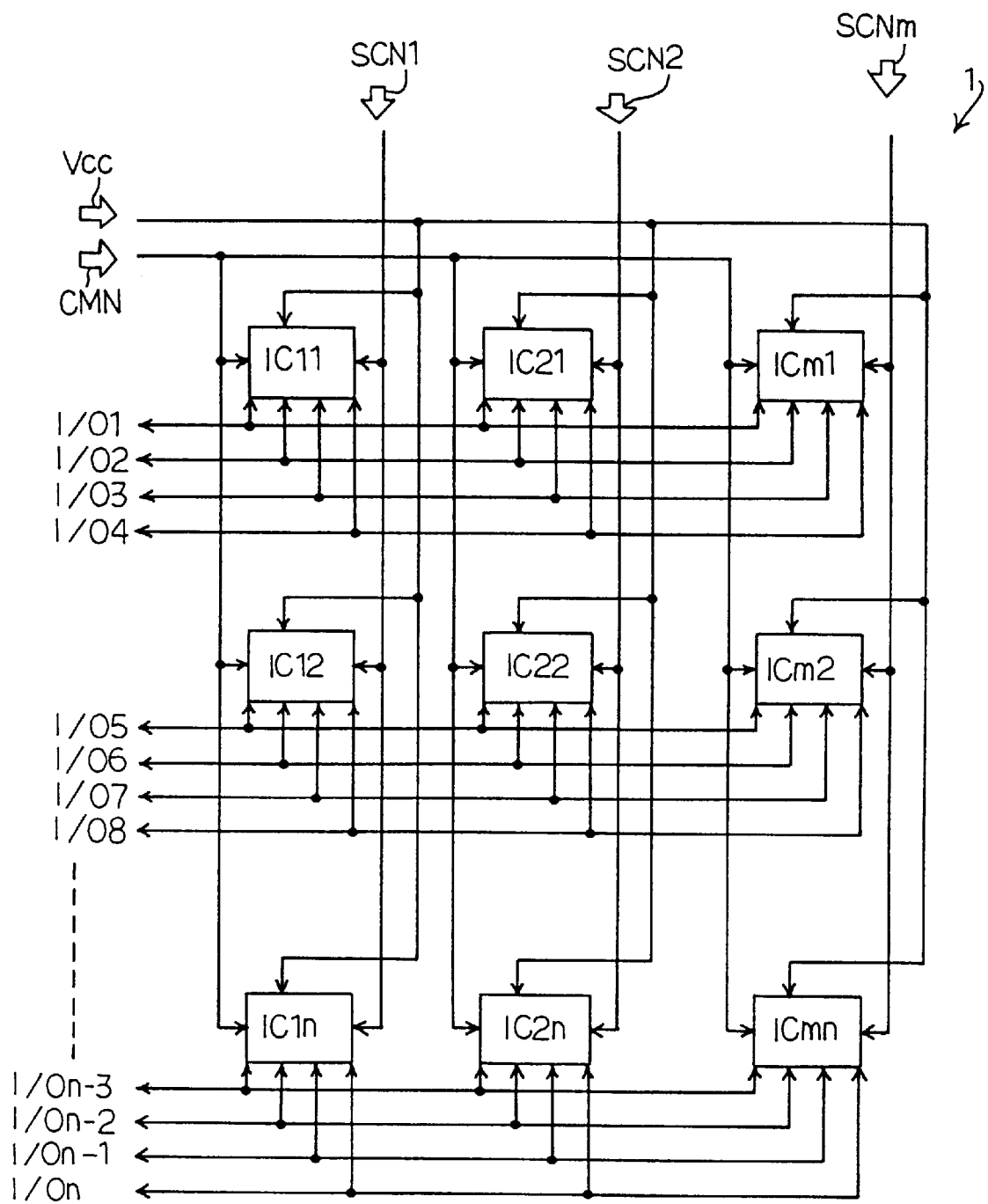
FIG. 2 is a circuit diagram of the burn-in board incorporated in the prior art testing system.
Figure 3:
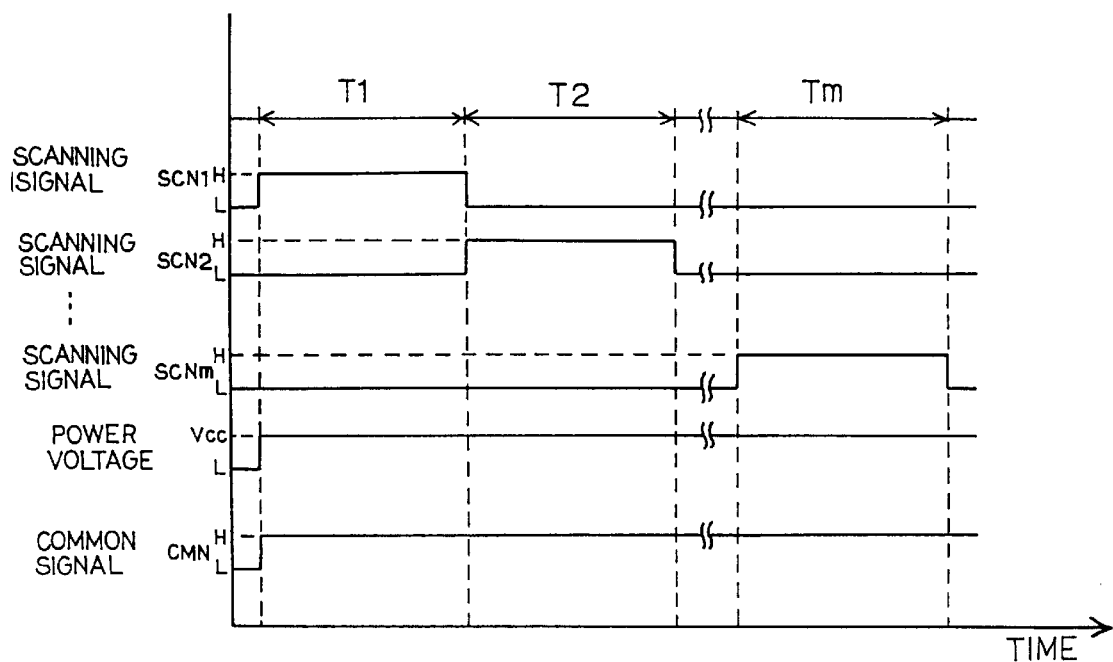
FIG. 3 is a timing chart showing a burn-in test carried out by using the prior art testing system.
Figure 4:
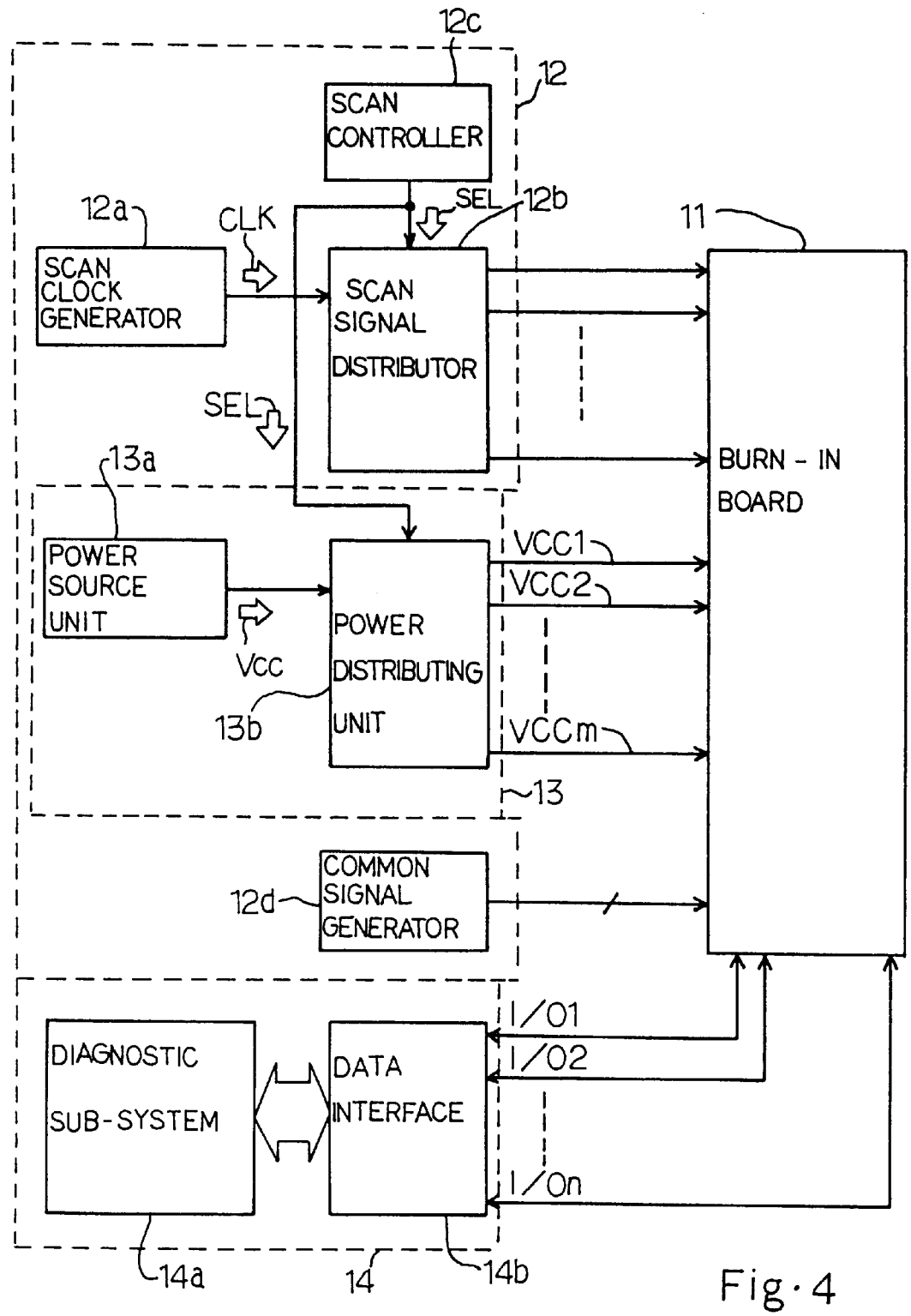
FIG. 4 is a block diagram showing a testing system according to the present invention.

Referring to FIG. 4 of the drawings, a testing system embodying the present invention largely comprises a burn-in board 11 for mounting products to be diagnosed, a control signal generator 12 for supplying scanning signals SCN1/SCN2/ . . . /SCNm and common control signals CMN to the burn-in board 11, a power distributor 13 for supplying electric power Vcc to the burn-in board 11 and a diagnostic unit 14 for communicating with the products through data signals. Test data represented by the data signals I/O1 to I/On are supplied from the diagnostic unit 14 to the burn-in board 11, and a test result returns from the burn-in board 11 through the data signals I/O1 to I/On to the diagnostic unit 14. Signal lines and power supply lines are hereinbelow labeled with the same references as those of the signals and the electric power.

Figure 5:
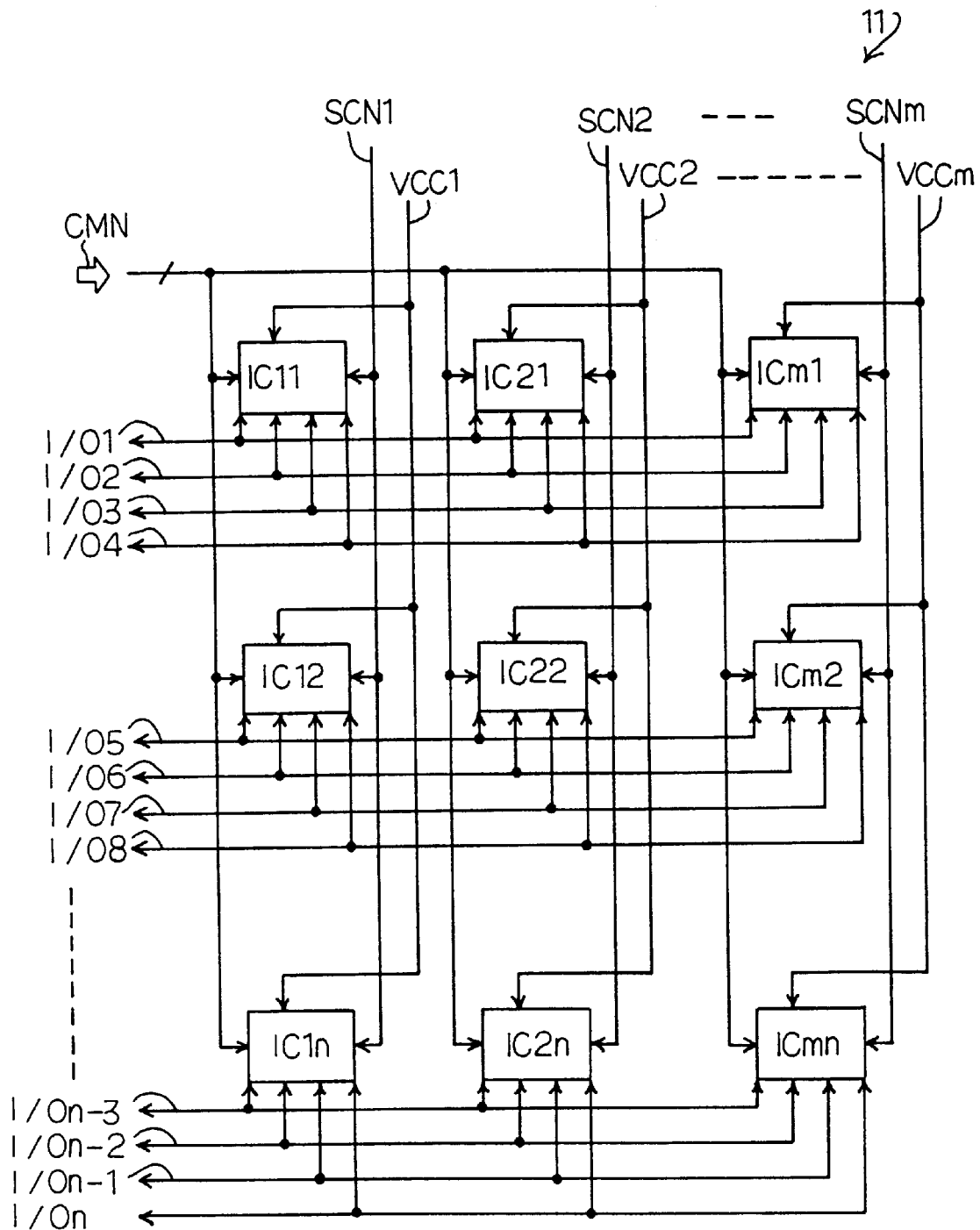
FIG. 5 is a circuit diagram showing the arrangement of signal lines on a burn-in board incorporated in the testing system.

The burn-in board 11 is illustrated in FIG. 5 in detail. Products of a semiconductor integrated circuit device IC11/IC12/IC1n, IC21/IC22/IC2n, ICm1/ICm2/ICmn to be diagnosed are mounted on sockets (not shown) arranged in rows and columns on the burn-in board 1, and are electrically connected through the contact pins of the sockets to the signal lines IO1 to IOn. In this instance, the semiconductor integrated circuit device is a random access memory device, and four memory cell sub-arrays are incorporated in the random access memory device.

Power supply lines VCC1, VCC2, . . . and VCCm are respectively associated with the columns of products IC11-IC1n, IC21-IC2n, . . . and ICm1-ICmn, and are connected through the sockets to the products IC11-IC1n, IC21-IC2n, . . . and ICm1-ICmn. The products of the semiconductor integrated circuit device IC11 to ICmn are powered with power potential Vcc and the ground potential supplied from the associated power supply lines VCC1 to VCCm.

Every four test signal lines I/O1 to I/O4, I/O5 to I/O8, . . . and I/On-3 to I/On are associated with one of the rows of products IC11-ICm1, IC12-ICm2, . . . and IC1n-ICmn, and the four test signal lines are connected through the sockets to the products of the associated row. The test data are supplied through the groups of the test signal lines I/O1 to I/On to the produces of the associated rows, respectively. The test result returns to the diagnostic unit 4 through the test signal lines I/O1 to I/On.

Scanning signal lines SCN1 to SCNm are respectively associated with the columns of products IC11-IC1n, IC21-IC2n, . . . and ICm1-ICmn, and are connected through the sockets to the products of the associated columns. The scanning signals SCN1 to SCNm are respectively supplied from scan signal generator 12 through the scanning signal lines SCN1 to SCNm and the sockets to the columns of products IC11-IC1n, IC21-IC2n, and ICm1-ICmn, and the common control signals CMN are distributed through common signal lines CMN to all the products of the semiconductor integrated circuit device IC11 to ICmn.

The burn-in board 11 heats the products IC11-ICmn during the test so as to accelerate a defect or defects of the products.

Turning back to FIG. 4, the control signal generator 12 includes a scan clock generator 12a, a scan signal distributor 12b and a scan controller 12c. The scan clock generator 12a generates a clock signal CLK, and supplies the clock signal CLK to the scan signal distributor 12b. On the other hand, the scan controller 12c generates a selecting signal SEL selectively specifying the scan signal lines SCN1 to SCNm, and supplies the selecting signal SEL to the scan signal distributor 12b. The scan signal distributor 12b is responsive to the selecting signal SEL so as to sequentially transfer the clock signal CLK to the scan signal lines SCN1 to SCnm as the scanning signals SCN1 to SCNm. Each of the scanning signal SCN1 to SCNm is supplied to signal pins of the associated products IC11-IC1n, IC21-IC2n or ICm1-ICmn of the associated column for selecting memory cells and starting the read/write sequence.

The control signal generator 12 further includes a common signal generator 12d, and the common signal generator 12d supplies the common control signals CMN to all the products on the burn-in board 1.

The power distributor 13 includes a power source unit 13a for generating the power voltage Vcc and a power distributing unit 13b responsive to the selecting signal SEL so as to distribute the power voltage Vcc to the power supply lines VCC1 to VCCm. Thus, the power distributing unit 13b is synchronized with the scan signal distributor 12b.

The diagnostic unit 14 includes a diagnostic sub-system 14a and a data interface 14b connected between the diagnostic sub-system 14a and the groups of the data signal lines I/O1 to I/O4, I/O5 to I/O8, . . . and I/On-3 to I/On. The diagnostic sub-system 14a produces the test data or test bits, and supplies the test bits through the data interface 14b to the data signal lines I/O1 to I/On. The test bits are written into the products activated by one of the scanning signals, and, thereafter, are read out therefrom. The read-out test bits are transferred through the data interface 14b to the diagnostic sub-system 14a, and the diagnostic circuit checks the read-out test bits to see whether or not the logic level is matched with an expected logic level.

Figure 6:
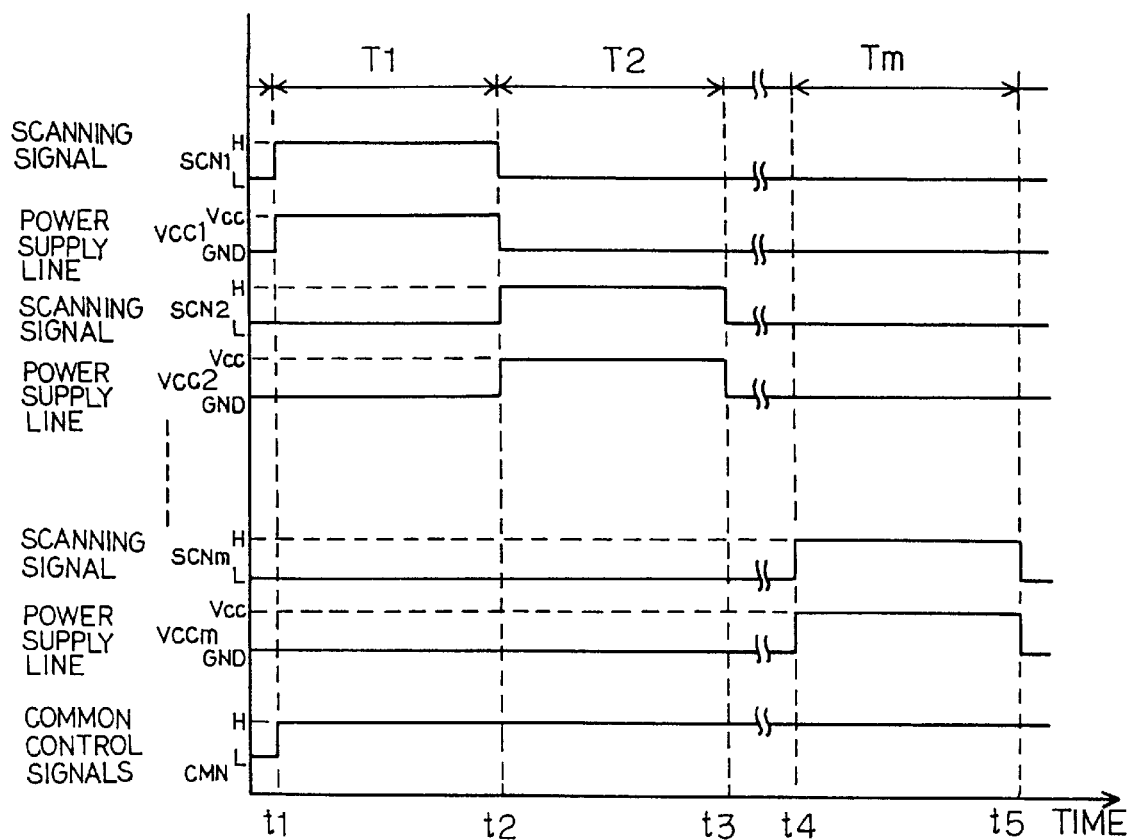
FIG. 6 is a timing chart showing a burn-in test carried out by using the testing system according to the present invention.

Description is hereinbelow made on a burn-in test with reference to FIG. 6. When the burn-in test starts, the scan controller 12c changes the columns of products represented by the selecting signal SEL, and the selecting signal SEL specifies the first column at time t1, the second column at time t2 and the last column at time t4. The common signal generator 12d is changed to the active high level at time t1.

The selecting signal SEL is supplied to both of the scan signal distributor 12b and the power distributing unit 13b, and the scan signal distributor 12b and the power distributing unit 13b sequentially change the scanning signals SCN1 to SCNm and the power supply lines VCC1 to VCCm from an inactive low level and the ground level to an active high level to the power voltage level Vcc, respectively.

The scanning signal SCN1 and the power supply line VCC1 are maintained at the active high level and the power voltage level Vcc in period T1, i.e., from time t1 to time t2, and the first column of products IC11 to IC1n is powered and becomes responsive to the test data bits. The diagnostic sub-system 14a supplies the test data bits through the data interface 14b and the data signal lines I/O1-I/On to the first column of products, and receives the read-out test data bits from the first column of products IC11-IC1n through the data interface 14b. While the first column of products IC11-IC1n is being subjected to the test, the other columns of products IC21-IC2n to ICm1-ICmn are in floating state, because the power supply lines VCC2-VCCm and the scanning signals SCN2-SCNm remain in the ground level and the inactive low level. For this reason, even if one of the products IC21-IC2n and ICm1-ICmn is a partially defective product with a damaged input/output transistor connected to a data pin, current does not flow through the damaged input/output transistor to the ground line, and the damaged input/output transistor does not affect the potential level on the associated data signal line. Even if one of the products IC21-IC2n and ICm1-ICmn is affected by noise, the product does not affect the potential level on the data signal lines, because it is not powered.

The scanning signal SCN2 and the power supply line VCC2 are maintained at the active high level and the power voltage level Vcc in period T2, i.e., from time t2 to time t3, and the second column of products IC21 to IC2n is powered and becomes responsive to the test data bits. The diagnostic sub-system 14a also supplies the test data bits through the data interface 14b and the data signal lines I/O1-I/On to the second column of products IC21-IC2n, and receives the read-out test data bits from the second column of products IC21-IC2n through the data interface 14b. While the second column of products IC21-IC2n is being subjected to the test, the other columns of products IC11-IC1n and ICm1-ICmn are in floating state, because the power supply lines VCC1 and VCCm and the scanning signals SCN1 and SCNm remain in the ground level and the inactive low level. For this reason, even if one of the products IC11-IC1n and ICm1-ICmn is the partially defective product, current does not flow through the damaged input/output transistor to the ground line, and the damaged input/output transistor does not affect the potential level on the associated data signal line. If one of the products IC11-ICn and ICm1-ICmn is exposed to noise, the product does not respond to the test data bits, nor affects the potential level on the data signal lines.

The scanning signal SCNm and the power supply line VCCm are maintained at the active high level and the power voltage level Vcc in period Tm, i.e., from time t4 to time t5, and the last column of products ICm1 to ICmn is powered and becomes responsive to the test data bits. The diagnostic sub-system 14a also supplies the test data bits through the data interface 14b and the data signal lines I/O1-I/On to the last column of products ICm1-ICmn, and receives the read-out test data bits from the last column of products ICm1-ICmn through the data interface 14b. While the first column of products ICm1-ICmn is being subjected to the test, the other columns of products IC11-IC1n to IC21-IC2n are in floating state, because the power supply lines VCC1–VCC2 and the scanning signals SCN1–SCN2 remain in the ground level and the inactive low level. For this reason, even if one of the products IC11-IC1n and IC21-IC2n is the partially defective product, current does not flow through the damaged data pin to the ground line, and the damaged data pin does not affect the potential level on the associated data signal line. If one of the products IC11-IC1n and IC21-IC2n is exposed to noise, the product does not respond to the test data bits, nor affects the potential level on the data signal lines.

In this instance, the scanning signal lines SCN1 to SCNm, the data signal lines I/O1 to I/On and the common signal lines CMN serve as the plurality of first signal lines, the plurality of second signal lines and the third signal lines, respectively.

As will be appreciated from the foregoing description, the power voltage Vcc is selectively supplied to the products mounted on the burn-in board, and non-activated product never affects the potential level on the data signal lines. For this reason, the read-out test data bits on the data signal lines I/O1 to I/On are reliable, and the diagnostic sub-system can exactly diagnose the products on the basis of the read-out test data bits.

Second Embodiment

Figure 7:
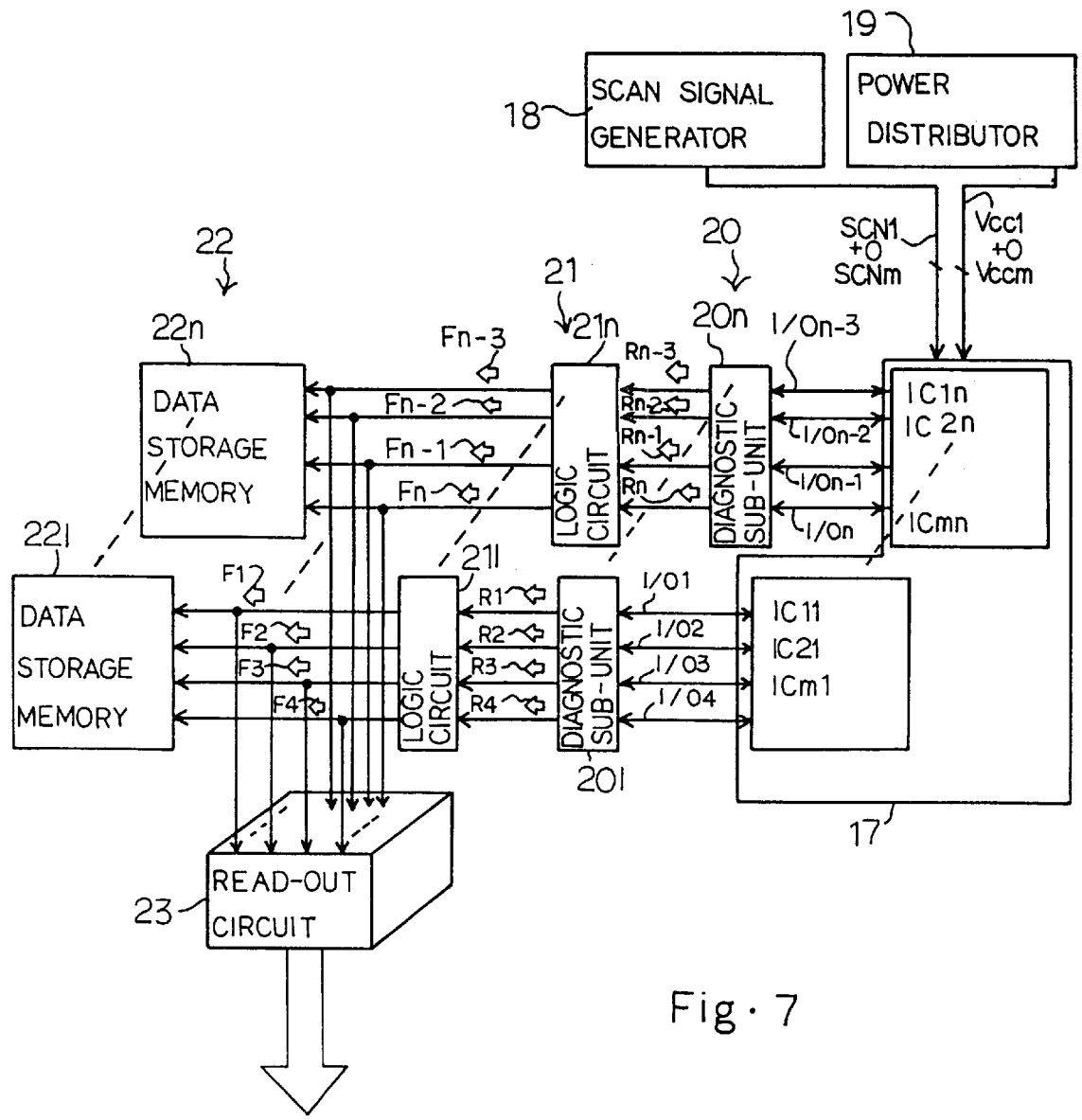
FIG. 7 is a block diagram showing the arrangement of another testing system according to the present invention.

Turning to FIG. 7 of the drawings, a logic unit 21, a data storage unit 22 and a read-out circuit 23 are incorporated in a testing system embodying the present invention. Although a burn-in board 17, a scan signal generator 18 and a power distributor 19 are represented by boxes in FIG. 7, the burn-in board 17, the scan signal generator 18 and the power distributor 19 are similar in circuit arrangement to the burn-in board 11, the scan signal generator 12 and the power distributor 13, and no further description is incorporated hereinbelow for avoiding repetition.

A diagnostic unit 20 is further incorporated in the testing system, and is similar in circuit arrangement and, accordingly, the function to the diagnostic unit 14. The diagnostic unit 20 is divided into n diagnostic sub-units 201 to 20n, and the diagnostic sub-units 201 to 20n are respectively connected through the data signal lines I/O1 to I/O4, I/O5 to I/O8, . . . and I/On-3 to I/On to the products IC11-ICm1, IC12-ICm2, . . . and IC1n-ICmn. Each of the diagnostic sub-units 201 to 20n supplies the test data bits to the associated products IC11-ICm1 . . . and IC1n-ICmn, and checks the read-out data bits to see whether or not the associated products are excellent. When the diagnostic sub-units 201 to 20n diagnoses the associated products I/O1 to I/On, preliminary resultant signals R1 to R4, . . . and Rn-3 to Rn are supplied from the diagnostic unit 20 to the logic unit 21. Each of the preliminary resultant signals R1 to Rn is representative of the diagnosis of the associated one of the products IC11 to ICmn.

The products I/O1 to I/On are subjected to a plurality of test items. A set of data signals is used in each test item, and is called as "test pattern". Therefore, the diagnostic sub-units 201 to 20n sequentially supply the test patterns to one of the columns of products I/O1 to I/O4, . . . or I/On-3 to I/On, and diagnose the products for the different test items.

The logic unit 21 is also divided into n logic circuits 211 to 21n, and are connected to the diagnostic sub-units 201 to 20n, respectively. The preliminary resultant signals R1 to Rn are divided into n preliminary resultant signal groups R1 to R4, . . . and Rn-3 to Rn, and the preliminary resultant signal groups R1 to R4, . . . and Rn-3 to Rn are respectively supplied to the logic sub-units 201 to 20n. As described hereinbefore, the preliminary resultant signal R1/ . . . /Rn represents the diagnoses of the different test items changed with time, and the logic circuits 211/ . . . /21n produce final resultant signals F1 to F4, . . . and Fn-3 to Fn representing whether the associated products are defective or not.

The table set forth below shows the preliminary resultant signals R1 to R4 and the final resultant signals F1 to F4 for the product IC1. As described hereinbefore, the semiconductor integrated circuit has four memory cell sub-arrays, and the diagnostic sub-unit 201 examines the four memory cell sub-arrays through the data signal lines I/O1 to I/O4.

The second column represents the preliminary resultant signals R1 to R4 produced in the previous test item, and the third column shows the preliminary resultant signals R1 to R4 produced in the present test item. The logic circuit 211 produces the final resultant signals F1 to F4 from the preliminary resultant signals R1 to R4 as shown in the fourth column of the table. In the table, mark "1" and mark "0" represent failure and pass, respectively.

TABLE

| Sub-arrays | Preliminary resultant signal | | Final resultant signal |
|---|---|---|---|
| | Previous test item | Present test item | |
| 1 | 1 | 0 | 1 |
| 2 | 1 | 1 | 1 |
| 3 | 0 | 0 | 0 |
| 4 | 0 | 1 | 1 |

The data storage unit 22 has four data storage memories 221 to 22n connected to the logic circuits 211 to 21n, and the data storage memories store the final results represented by the final resultant signals F1 to Fn in a rewritable manner. The data storage unit 22 may have addresses equal to the product between the products of the semiconductor integrated circuit device and the memory cell sub-arrays of each product.

According to the table, the first memory cell sub-array of the product I/C1 failed in the previous test item, and mark "1" was stored in the data storage memory 221. The diagnostic sub-unit 201 produces the preliminary resultant signal R1 representing that the first memory cell sub-array passes the present test item. However, the logic circuit 211 keeps the final resultant signal representative of mark "1", because the failure in the previous test item is not cured. The mark "1" is rewritten in the data storage memory 221.

The second memory cell sub-array of the product I/C2 failed in the previous test item, and mark "1" was stored in the data storage memory 221. The diagnostic sub-unit 201 produces the preliminary resultant signal R1 representing that the second memory cell sub-array fails in the present test item, again. The logic circuit 211 keeps the final resultant signal representative of mark "1". The mark "1" is rewritten in the data storage memory 221.

The third memory cell sub-array of the product I/C3 passed the previous test item, and mark "0" was stored in the data storage memory 221. The diagnostic sub-unit 201 produces the preliminary resultant signal R1 representing that the third memory cell sub-array passes the present test item. Then, the logic circuit 211 keeps the final resultant signal representative of mark "0". The mark "0" is rewritten in the data storage memory 221.

The fourth memory cell sub-array of the product I/C4 passed the previous test item, and mark "0" was stored in the data storage memory 221. The diagnostic sub-unit 201 produces the preliminary resultant signal R1 representing that the fourth memory cell sub-array fails in the present test item. Then, the logic circuit 211 changes the final resultant signal from mark "0" to mark "1", because a defect is found in the product I/C4. The mark "1" is rewritten in the data storage memory 221.

Upon completion of all the test items for all of the products IC11 to ICmn, the read-out circuit 23 accesses the final resultant data stored in the data storage unit 22, and reads out the final resultant data to a classifying system (not shown). If the four memory cell sub-arrays of a product are marked with "0", the product is classified as "excellent product". If three memory cell sub-arrays of another product are marked with "0" and one memory cell sub-array is marked with "1", the product is classified as "partially defective product". However, if more than one memory cell sub-array of yet another product is marked with "1", the product is classified as "defective product".

Figure 8:
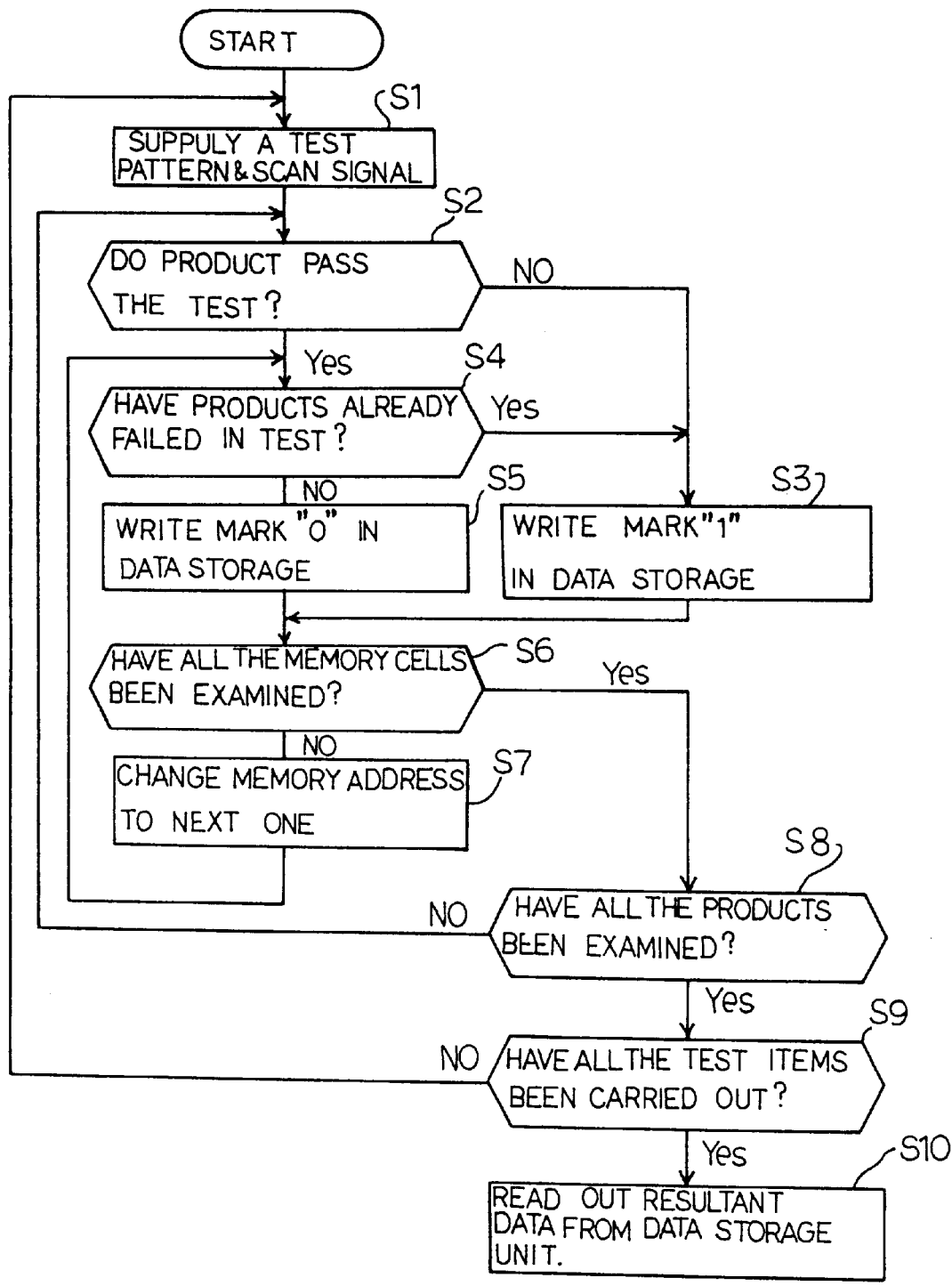
FIG. 8 is a flow chart showing a testing sequence carried out by using the testing system shown in FIG. 7.

FIG. 8 illustrates the testing sequence carried out by the testing system shown in FIG. 7. The scan signal generator 18 and the power distributor 19 supply the scanning signal SCN1 and the power voltage Vcc to the burn-in board 17 so as to activate the column of products IC11 to IC11 to IC1n, and the diagnostic unit 20 supplies a first test pattern to the data signal lines I/O1 to I/On as by step S1. The products IC11 to IC1n respond to the first test pattern, and the test result returns to the diagnostic unit 20 through the data signal lines I/O1 to I/On.

The diagnostic unit 20 compares the test result with the expected result for the first test pattern, and diagnoses the products IC11 to IC1n whether they pass or fail in the first test as by step S2. The diagnostic unit 20 supplies the preliminary resultant signals R1 to Rn to the logic unit 21. If the products IC11 to IC1n fail in the test, the answer at step S2 is given negative, and the logic unit 21 produces the final resultant signals F1 to Fn representative of marks "1". Then, mark "1" is written into the data storage unit 221 as by step S3.

On the other hand, if the products IC11 to IC1n pass the first test, the answer at step S2 is given affirmative, and the logic unit 21 checks the preliminary resultant signals in the previous test item to see whether or not the products IC11 to IC1N have already failed in the test as by step S4.

If the answer at step S4 is given affirmative, the logic unit rewrites mark "1" in the data storage unit 22. On the other hand, if the answer at step S4 is given negative, the logic unit 21 produces the final resultant signals F1 to Fn representative of mark "0", and mark "0" is rewritten in the data storage unit 22 as by step S5.

Upon completion of step S3 or S5, the diagnostic unit 20 checks a memory address to see whether or not all the memory cells have been already examined as by step S6.

If the answer at step S6 is given negative, the diagnostic unit 20 changes the memory address to the next one as by step S7, and returns to step S1. Thus, the diagnostic unit 20 and the logic unit 21 reiterate the loop consisting of steps S1 to S7 until all the memory cells are examined.

When the first test item is completed on all the memory cells, the answer at step S6 is given affirmative, and the scan signal generator 18 and the power distributor 19 changes the scanning signal and the power distribution line from SCN1/VCC1 to SCN2/VCC2. Thereafter, the testing system checks the scan signal generator 18 and the power distributor 19 to see whether all the columns of products have been examined as by step S8.

The answer at step S8 is given negative until the scanning signal and the power distribution line have been already changed to SCNm and VCCm. While the answer at step S8 is being given negative, the testing system reiterates the loop consisting of steps S1 to S8 so as to examine all the products IC11 to ICmn on the burn-in board 17.

When the last memory cells of the products ICm1-ICmn was examined for the first test item, the answer at step S8 is given affirmative, and the testing system checks the diagnostic unit 20 to see whether all the test items have been already carried out as by step S9.

If the answer at step S9 is given negative, the diagnostic unit changes the test pattern from the present item to the next item, and returns to step S1. Thus, the testing system reiterates the loop consisting of steps S1 to S9 until all the test items are carried out.

When all the test items were carried out, the answer at step S9 is given affirmative, and the read-out circuit 23 accesses the resultant data stored in the data storage unit 22. The resultant data are read out from the data storage unit 22 as by step S10.

As will be understood from the foregoing description, the testing system according to the present invention exactly diagnoses the products on the burn-in board without undesirable influence of a partially defective product, and automatically classifies the products between the excellent group, the partially defective group and the defective group.

Although particular embodiments of the present invention have been shown and described, it will be obvious to those skilled in the art that various changes and modifications may be made without departing from the spirit and scope of the present invention.

For example, the testing system according to the present invention is available for any kind of semiconductor integrated circuit device such as, for example, a microprocessor, a logic circuit and another kind of semiconductor memory device. A test may be carried out without a burn-in.

The logic unit 21, the data storage unit 22 and the read-out circuit 23 may be integrated together with the diagnostic unit 20 or form a module separated from the diagnostic unit 20.

What is claimed is:

1. A testing system for diagnosing products of a semiconductor device comprising:
   a board member selectively mounting said products divided into product groups respectively assigned addresses;
   a plurality of first signal lines electrical connected to said product groups, and supplying selecting signals successively representing said addresses at different timings to said product groups for selectively activating said products;
   a plurality of power supply lines electrically connected to said product groups, and selective supplying an electric power to the products specified by said selecting signals;
   a plurality of second signal lines electrically connected to said product groups, and supplying data signals to said products so that said products specified by said selecting signals respond to said data signals; and
   a diagnostic unit connected to said second signal lines so as to check said second signal lines to determine whether or not said products specified by said selecting signals are defective.

2. The testing system as set forth in claim 1, in which said products on said board are heated so as to accelerate a defect in said products.

3. The testing system as set forth in claim 1, in which said plurality of first signal lines and said plurality of power supply lines are connected to a scan signal generator for generating said selecting signal and a power distributor for selectively supplying said electric power to said products in synchronism with said scan signal generator.

4. The testing system as set forth in claim 3, in which said scan signal generator includes
   a scan clock generator for producing a clock signal,
   a scan controller for producing a control signal sequentially specifying said addresses, and
   a scan signal distributor connected to said scan clock generator and said scan controller and responsive to said control signal for sequentially distributing said clock signal to said plurality of first signal lines as said selecting signal.

5. The testing system as set forth in claim 3, in which said scan signal generator includes
   a scan clock generator for producing a clock signal,
   a scan controller for producing a control signal sequentially specifying said addresses, and
   a scan signal distributor connected to said scan clock generator and said scan controller and responsive to said control signal for sequentially distributing said clock signal to said plurality of first signal lines as said selecting signal, and
   said power distributor includes
   a power source unit for generating said electric power, and
   a power distributing unit connected to said scan controller and said power source and responsive to said control signal for sequentially distributing said electric power to said plurality of power supply lines.

6. The testing system as set forth in claim 1, further comprising third signal lines connected to said products so as to supply control signals thereto.

7. The testing system as set forth in claim 1, in which said diagnostic unit sequentially carries out a plurality of test items for producing preliminary diagnostic signals representative of diagnoses of said products specified by said selecting signal, said diagnoses being changed together with said test items, said testing system further comprising a judging unit connected to said diagnostic unit which checks said preliminary diagnostic signals representative of said diagnoses changed together with said test items to determine whether or not said products pass all the test items.

8. The testing system as set forth in claim 7, in which said judging unit includes a data storage unit having a plurality of addresses and storing said preliminary diagnoses in a rewritable manner, a logic, unit connected between said diagnostic unit and said data storage unit, which carries out a logical operation on said preliminary diagnoses for one of said test items and said preliminary diagnoses for another of said test items to determine whether or not said products pass all the test items and rewriting said preliminary diagnoses in said data storage unit, and a read-out circuit connected to said data storage unit and reading out said preliminary diagnoses from said data storage unit as final diagnoses upon completion of said test times.

9. The testing system of claim 8, wherein said preliminary diagnoses for said another of said test items are preliminary diagnoses produced for previous test items.

10. The testing system of claim 9, further comprising:

a classifying unit connected to said read-out circuit, said classifying unit classifying said product based on said final diagnoses.

11. The testing system of claim 10, wherein at least one of said products includes a plurality of sub-circuits, said diagnostic unit sequentially carrying out a plurality of test items for each of said sub-circuits to produce preliminary diagnostic signals representative of diagnoses of said product and said judging unit checking the preliminary diagnostic signals for each of said sub-circuits to determine whether or not said product passes said plurality of test items, wherein said logic unit carries out said logical operation on the diagnoses for the sub-circuits for one of said test items and diagnoses for said sub-circuits for a previous test item, a result of which is written into said read-out circuit as final diagnoses, wherein said classifying system classifies said product as excellent if said final diagnoses all agree with a predetermined result, classifies said product as partially defective if one diagnoses of said final diagnoses agrees does not agree with said predetermined result, and classifies said product as defective if at least two of said final diagnoses do not agree with said predetermined result.

* * * * *